United States Patent [19]
Saito et al.

[11] Patent Number: 5,166,644
[45] Date of Patent: Nov. 24, 1992

[54] PLL SYNTHESIZER CIRCUIT

[75] Inventors: Shinji Saito; Akira Kobayashi, both of Kasugai, Japan

[73] Assignees: Fujitsu Limited, Kawasaki; Fujitsu VLSI Limited, Kasugai, both of Japan

[21] Appl. No.: 812,919

[22] Filed: Dec. 26, 1991

[30] Foreign Application Priority Data

Dec. 26, 1990 [JP] Japan .................................. 2-406924

[51] Int. Cl.$^5$ ......................... H03L 7/089; H03L 7/17
[52] U.S. Cl. .................................... 331/17; 331/1 A; 331/16; 331/18; 331/25
[58] Field of Search ..................... 331/1 A, 16, 17, 18, 331/25; 455/260

[56] References Cited

U.S. PATENT DOCUMENTS 4,987,387 1/1991 Kennedy et al. .................. 331/1 A Primary Examiner—David Mis
Attorney, Agent, or Firm—Staas & Halsey

[57] ABSTRACT

A PLL synthesizer circuit includes a lowpass filter including capacitors for restricting an output voltage of the lowpass filter, a charge pump circuit for controlling the output voltage of the lowpass filter by charging or discharging the capacitors of the lowpass filter, a voltage controlled oscillator for outputting an output signal having a frequency which is controlled by the output voltage of the lowpass filter, a frequency divider for frequency-dividing the output signal of the voltage controlled oscillator to output a comparison signal and having a variable frequency dividing ratio, a phase comparator for comparing a phase of a reference signal having a predetermined frequency and a phase of the comparison signal output from the frequency divider to output phase error information which indicates a phase lead and a phase lag of the comparison signal with respect to the reference signal, and a charge pump control circuit for forming control information based on the phase error information when switching a frequency of the output signal of the voltage controlled oscillator from a first frequency to a second frequency and for supplying the control information to the charge pump circuit. The charge pump circuit charges or discharges the capacitors of the lowpass filter independently of the reference signal based on the control information until the output signal of the voltage controlled oscillator reaches the second frequency, so as to raise or lower the output voltage of the lowpass filter depending on the charging or discharging. The output signal of the voltage controlled oscillator is used as an output signal of the PLL synthesizer circuit.

10 Claims, 11 Drawing Sheets

PLL SYNTHESIZER CIRCUIT

BACKGROUND OF THE INVENTION

The present invention generally relates to phase locked loop (PLL) synthesizer circuits, and more particularly to a PLL synthesizer circuit in which an output signal frequency of a voltage controlled oscillator can be switched at a high speed.

FIG. 1 shows an example of a conventional PLL synthesizer circuit. The PLL synthesizer circuit includes a crystal oscillator 1, a reference frequency divider 2, a comparison frequency divider 3, a phase comparator 4, a charge pump circuit 5, a lowpass filter 6, and a voltage controlled oscillator (VCO) 7 which are connected as shown. The reference frequency divider 2 frequency-divides an output signal of the crystal oscillator 1 and outputs a reference signal Sr. The comparison frequency divider 3 frequency-divides an output signal SVCO of the VCO 7 and outputs a comparison signal Sp. The phase comparator 4 compares the phases of the reference signal Sr and the comparison signal Sp, and outputs signals for adjusting an output voltage VLPF of the lowpass filter 6 via the charge pump circuit 5 so that the phase error becomes zero. The charge pump circuit 5 outputs a signal SCP. The output signal SVCO of the VCO 7 is locked to a target frequency, and this output signal SVCO of the VCO 7 is output as an output signal of the PLL synthesizer circuit.

The phase comparator 4 is of the so-called phase discrimination type, and discriminates the phase lag and phase lead of the comparison signal Sp with respect to the reference signal Sr. The phase comparator 4 outputs a signal $\phi r$ which indicates the phase lag of the comparison signal Sp with respect to the reference signal Sr and a signal $\phi p$ which indicates the phase lead of the comparison signal Sp with respect to the reference signal Sr and a signal $\phi p$. The signals $\phi r$ and $\phi p$ are output independently from the phase comparator 4.

For example, the charge pump circuit 5 and the lowpass filter 6 have a construction shown in FIG. 2. When the signals $\phi r$ and $\phi p$ both have a low level in FIG. 2, a PNP transistor 51 turns ON and an NPN transistor 52 turns OFF, thereby making a charging operation with respect to capacitors 61 and 62. On the other hand, when the signals $\phi r$ and $\phi p$ both have a high level in FIG. 2, the PNP transistor 51 turns OFF and the NPN transistor 52 turns ON, thereby making a discharging operation with respect to the capacitors 61 and 62. When the signal $\phi r$ has the high level and the signal $\phi p$ has the low level, the transistors 51 and 52 both turn OFF and the capacitors 61 and 62 enter a floating state. In this case, the charged voltages are held by the capacitors 61 and 62, and the output voltage VLPF of the lowpass filter 6 stabilizes.

FIGS. 3 and 4 are timing charts for explaining the operation of the charge pump circuit 5 of the conventional PLL synthesizer circuit shown in FIG. 1. FIG. 3 shows the timing chart for explaining the operation of the charge pump circuit 5 when the frequency dividing ratio of the comparison frequency divider 3 is increased from the state where the output signal SVCO of the VCO 7 is locked to a frequency f1 and the output signal SVCO locks to a frequency f2 which is greater than the frequency f1, where fr denotes the frequency of the reference signal Sr and Fp denotes the frequency of the comparison signal Sp. FIG. 4 shows the timing chart for explaining the operation of the charge pump circuit 5 when the frequency dividing ratio of the comparison frequency divider 3 is decreased from the state where the output signal SVCO of the VCO 7 is locked to the frequency f2 and the output signal SVCO locks to the frequency f1.

As may be seen from FIGS. 3 and 4, the falling edge of the phase comparison signal $\phi r$ is synchronized to the rising edge of the reference signal Sr regardless of whether the PLL synthesizer circuit is in the locked state or the unlocked state. In addition, the rising edge of the phase comparison signal $\phi p$ is synchronized to the rising edge of the comparison signal Sp regardless of whether the PLL synthesizer circuit is in the locked state or the unlocked state.

However, when the frequency dividing ratio of the comparison frequency divider 3 is increased from the state where the output signal SVCO of the VCO 7 is locked to the frequency f1 and state changes to the unlocked state where fr > fp, the low-level period of the phase comparison signal $\phi r$ is enlarged by a width which is slightly greater than the phase delay of the comparison signal Sp with respect to the reference signal Sr as shown in FIG. 3 in a state where the falling edge of the phase comparison signal $\phi r$ remains synchronized to the rising edge of the reference signal Sr. In this case, the rising edge of the phase comparison signal $\phi p$ remains synchronized to the rising edge of the comparison signal Sp, and no change occurs as for the high-level period of the phase comparison signal $\phi p$.

As a result, the charge pump circuit 5 intermittently turns ON the PNP transistor 51 in synchronism with the rising edge of the reference signal $\phi r$, and intermittently supplies a charge voltage to the lowpass filter 6. Hence, the output voltage VLPF of the lowpass filter 6 rises, and the frequency of the output signal SVCO of the VCO 7 increases to the frequency f2.

When the frequency of the output signal SVCO of the VCO 7 rises to the frequency f2, the frequency fr of the reference signal Sr and the frequency fp of the comparison signal Sp become equal (that is, fr=fp), and the phase comparison signal $\phi r$ returns to a state which indicates that there is no phase error between the reference signal Sr and the comparison signal Sp. Consequently, the capacitances 61 and 62 of the lowpass filter 6 assume the floating state, and the charged voltage in the capacitors 61 and 62 are held. The output voltage VLPF of the lowpass filter 6 stabilizes to the voltage at which the frequency of the output signal SVCO of the VCO 7 becomes the frequency f2, and the frequency of the output signal SVCO of the VCO 7 is locked to the frequency f2.

On the other hand, when the frequency dividing ratio of the comparison frequency divider 3 is decreased from the state where the output signal SVCO of the VCO 7 is locked to the frequency f2 and state changes to the unlocked state where fr < fp, the high-level period of the phase comparison signal $\phi p$ is enlarged by a width which is slightly greater than the phase lead of the comparison signal Sp with respect to the reference signal Sr as shown in FIG. 4 in a state where the falling edge of the phase comparison signal $\phi p$ remains synchronized to the rising edge of the reference signal Sr. In this case, the falling edge of the phase comparison signal $\phi r$ remains synchronized to the rising edge of the comparison signal Sp, and no change occurs as for the low-level period of the phase comparison signal $\phi r$.

As a result, the charge pump circuit 5 intermittently turns ON the NPN transistor 52 in synchronism with the rising edge of the comparison signal Sp, and intermittently discharges the capacitors 61 and 62 of the lowpass filter 6. Hence, the output voltage VLPF of the lowpass filter 6 falls, and the frequency of the output signal SVCO of the VCO 7 decreases to the frequency f1.

When the frequency of the output signal SVCO of the VCO 7 falls to the frequency f1, the frequency fr of the reference signal Sr and the frequency fp of the comparison signal Sp become equal (that is, fr=fp), and the phase comparison signal φp returns to a state which indicates that there is no phase error between the reference signal Sr and the comparison signal Sp. Consequently, the capacitances 61 and 62 of the lowpass filter 6 assume the floating state, and the charged voltage in the capacitors 61 and 62 are held. The output voltage VLPF of the lowpass filter 6 stabilizes to the voltage at which the frequency of the output signal SVCO of the VCO 7 becomes the frequency f1, and the frequency of the output signal SVCO of the VCO 7 is locked to the frequency f1.

When charging the capacitors 61 and 62 which form the lowpass filter 6 of the conventional PLL synthesizer circuit, the charging operation is intermittently carried out in synchronism with the reference signal Sr. In addition, the discharging operation is carried out intermittently in synchronism with the comparison signal Sp. For this reason, there is a problem in that the frequency of the output signal SVCO of the VCO 7 cannot be switched at a high frequency.

Presently, communication systems such as mobile telephone sets are all analog systems. However, when such communication systems are changed to digital systems, it becomes desirable to tune to a desired frequency at a high speed particularly in the case of a digital mobile telephone set. In other words, there is a demand to realize a PLL synthesizer circuit in which the lock-up time is extremely short.

SUMMARY OF THE INVENTION

Accordingly, it is a general object of the present invention to provide a novel and useful PLL synthesizer circuit in which the problem described above is eliminated and the above described demand is satisfied.

Another and more specific object of the present invention is to provide a PLL synthesizer circuit comprising a lowpass filter including capacitors for restricting an output voltage of the lowpass filter, a charge pump circuit, coupled to the lowpass filter, for controlling the output voltage of the lowpass filter by charging or discharging the capacitors of the lowpass filter, a voltage controlled oscillator, coupled to the lowpass filter, for outputting an output signal having a frequency which is controlled by the output voltage of the lowpass filter, a frequency divider, coupled to the voltage controlled oscillator, for frequency-dividing the output signal of the voltage controlled oscillator and for outputting a comparison signal, the frequency divider having a variable frequency dividing ratio, a phase comparator, coupled to the frequency divider, for comparing a phase of a reference signal having a predetermined frequency and a phase of the comparison signal output from the frequency divider, the phase comparator outputting phase error information which indicates a phase lead and a phase lag of the comparison signal with respect to the reference signal, and a charge pump control circuit, coupled between the phase comparator and the charge pump circuit, for forming control information based on the phase error information when switching a frequency of the output signal of the voltage controlled oscillator from a first frequency to a second frequency, and for supplying the control information to the charge pump circuit, where the charge pump circuit charges or discharges the capacitors of the lowpass filter independently of the reference signal based on the control information until the output signal of the voltage controlled oscillator reaches the second frequency, so as to raise or lower the output voltage of the lowpass filter depending on the charging or discharging, and the output signal of the voltage controlled oscillator is used as an output signal of the PLL synthesizer circuit. According to the PLL synthesizer circuit of the present invention, the output voltage of the lowpass filter can be raised and lowered at a high speed, thereby making it possible to switch the output signal frequency of the voltage controlled oscillator at a high speed.

Other objects and further features of the present invention will be apparent from the following detailed description when read in conjunction with the accompanying drawings.

DESCRIPTION OF THE PREFERRED EMBODIMENTS

Figure 1:
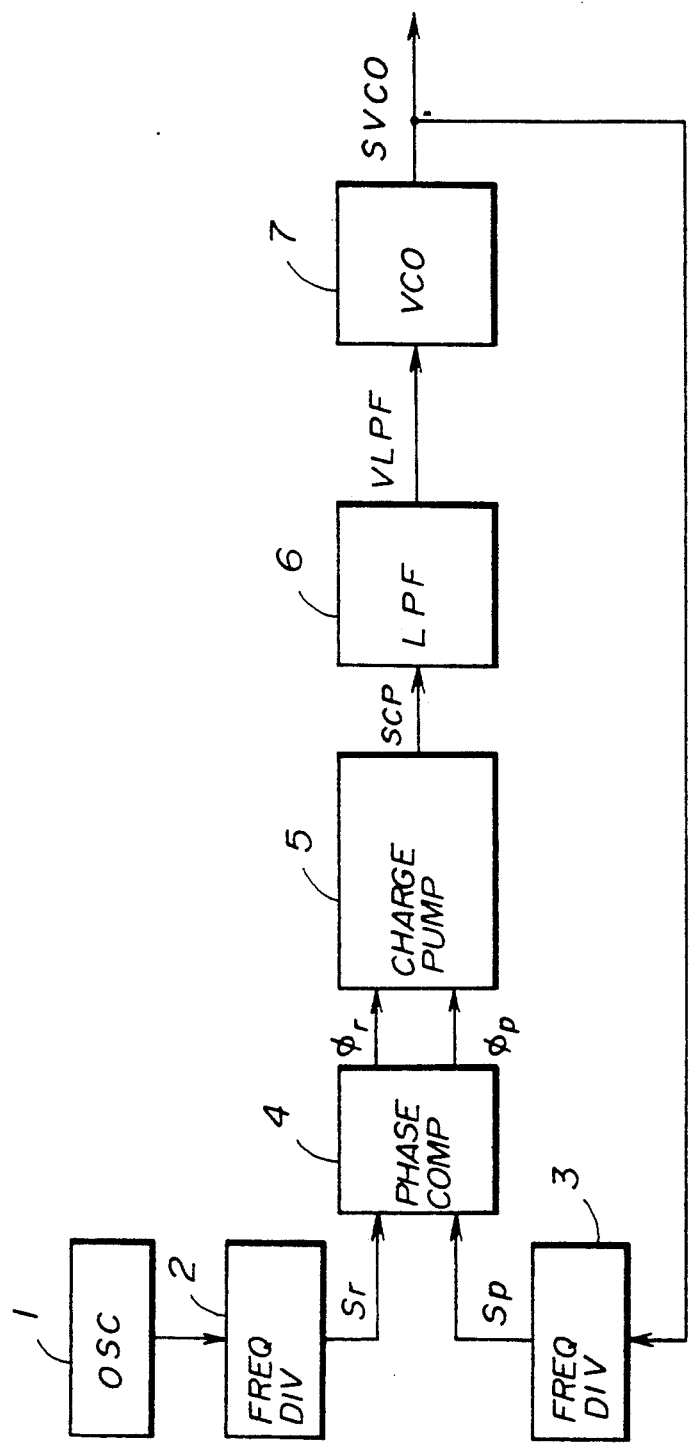
FIG. 1 is a system block diagram showing an example of a conventional PLL synthesizer circuit according to the present invention.
Figure 5:
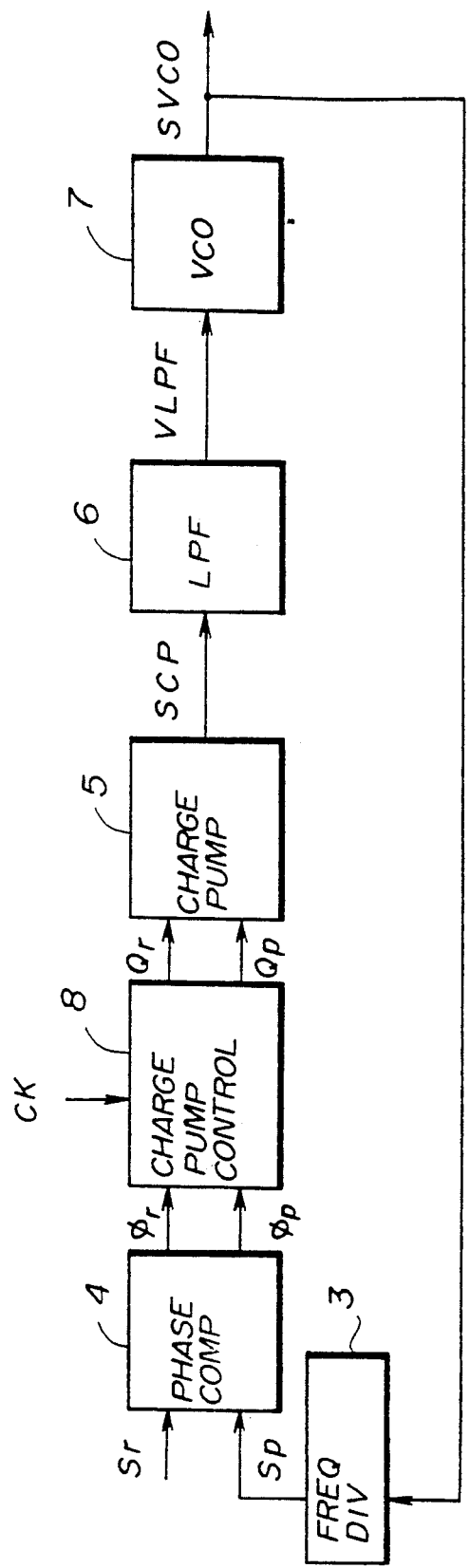
FIG. 5 is a system block diagram showing a first embodiment of a PLL synthesizer circuit according to the present invention.

First, a description will be given of a first embodiment of the PLL synthesizer circuit according to the present invention, by referring to FIG. 5. In FIG. 5, those parts which are the same as those corresponding parts in FIG. 1 are designated by the same reference numerals.

The PLL synthesizer circuit shown in FIG. 5 includes a comparison frequency divider 3, a phase comparator 4, a charge pump control circuit 8, a charge pump circuit 5, a lowpass filter 6, and a voltage controlled oscillator (VCO) 7 which are connected as shown. The comparison frequency divider 3 has a variable frequency dividing ratio and frequency-divides an output signal SVCO of the VCO 7 and outputs a comparison signal Sp. The phase comparator 4 is of the phase discrimination type and compares the phases of a reference signal Sr and the comparison signal Sp, and outputs phase comparison signals φr and φp. The phase comparison signals φr and φp respectively indicate the phase lead and phase lag of the comparison signal Sp with respect to the reference signal Sr. The charge pump circuit 5 charges or discharges capacitors of the lowpass filter 6 so as to control an output voltage VLPF of the lowpass filter 6. The frequency of the output signal SVCO of the VCO 7 is controlled by the output voltage VLPF of the lowpass filter 6.

The charge pump control circuit 8 varies the frequency dividing ratio of the comparison frequency divider 3 and forms the phase comparison signals φr and φp into signals Qr and Qp for controlling the operation of the charge pump circuit 5 in response to an external clock signal CK when switching the frequency of the output signal SVCO of the VCO 7. In other words, the operation of the charge pump circuit 5 is controlled so that the output voltage VLPF of the lowpass filter 6 is raised or lowered by charging or discharging the capacitors of the lowpass filter 6 virtually without interruption until the frequency of the output signal SVCO of the VCO 7 reaches a target frequency.

The charging or discharging of the capacitors of the lowpass filter 6 for restricting the output voltage VLPF of the lowpass filter 6 is carried out virtually without interruption, that is, in an essentially continuous manner. For this reason, compared to the conventional PLL synthesizer circuit in which the charging or discharging is carried out intermittently, the output voltage VLPF of the lowpass filter 6 can be raised and lowered at a high speed in the PLL synthesizer circuit according to the present invention. Therefore, the frequency of the output signal SVCO of the VCO 7 can be switched at a high speed.

Figure 6:
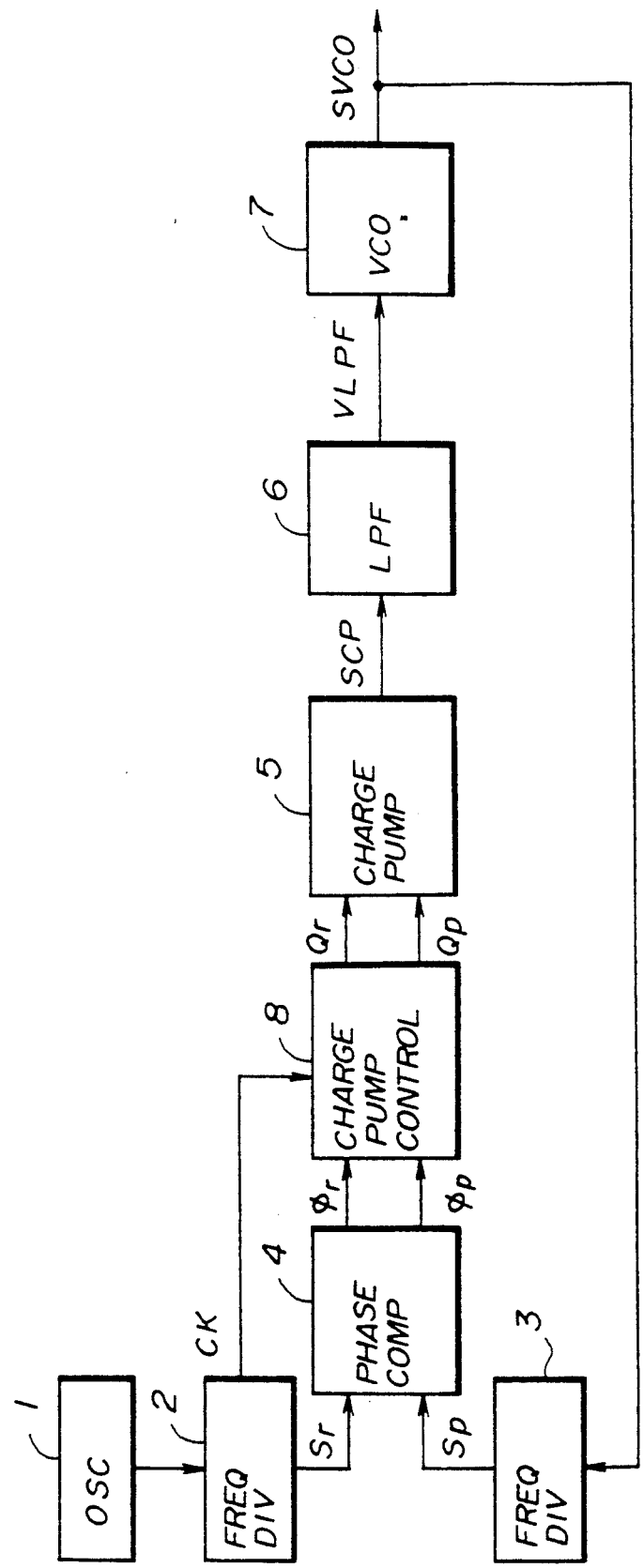
FIG. 6 is a system block diagram showing a second embodiment of the PLL synthesizer circuit according to the present invention.

Next, a description will be given of a second embodiment of the PLL synthesizer circuit according to the present invention, by referring to FIG. 6. In FIG. 6, those parts which are the same as those corresponding parts in FIGS. 1 and 5 are designated by the same reference numerals, and a description thereof will be omitted.

This embodiment of the PLL synthesizer circuit shown in FIG. 6 differs from the conventional PLL synthesizer circuit shown in FIG. 1 in that the charge pump control circuit 8 is provided between the phase comparator 4 and the charge pump circuit 5. This charge pump control circuit 8 controls the operation of the charge pump circuit 5 in response to the clock signal CK from the reference frequency divider 2. Otherwise, this embodiment of the PLL synthesizer circuit is basically the same as the conventional PLL synthesizer circuit.

Figure 7:
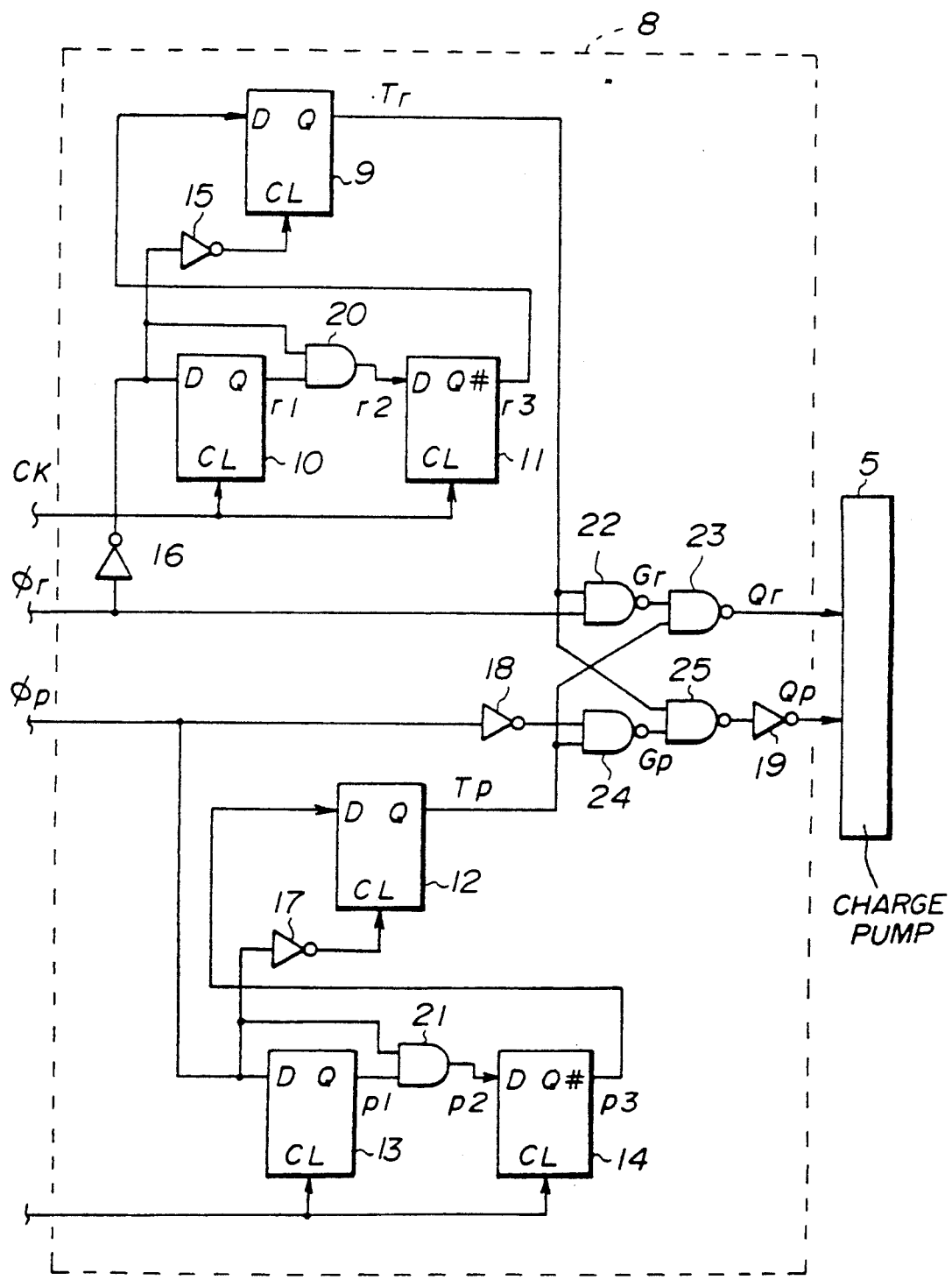
FIG. 7 is a circuit diagram showing a charge pump control circuit and a charge pump circuit shown in FIG. 6.

For example, the charge pump control circuit 8 includes D flip-flops 9 through 14, inverters 15 through 19, AND circuits 20 and 21, and NAND circuits 22 through 25 which are connected as shown in FIG. 7. In FIG. 7, Q# denotes an inverted output of the D flip-flops 11 and 14.

Figure 8:
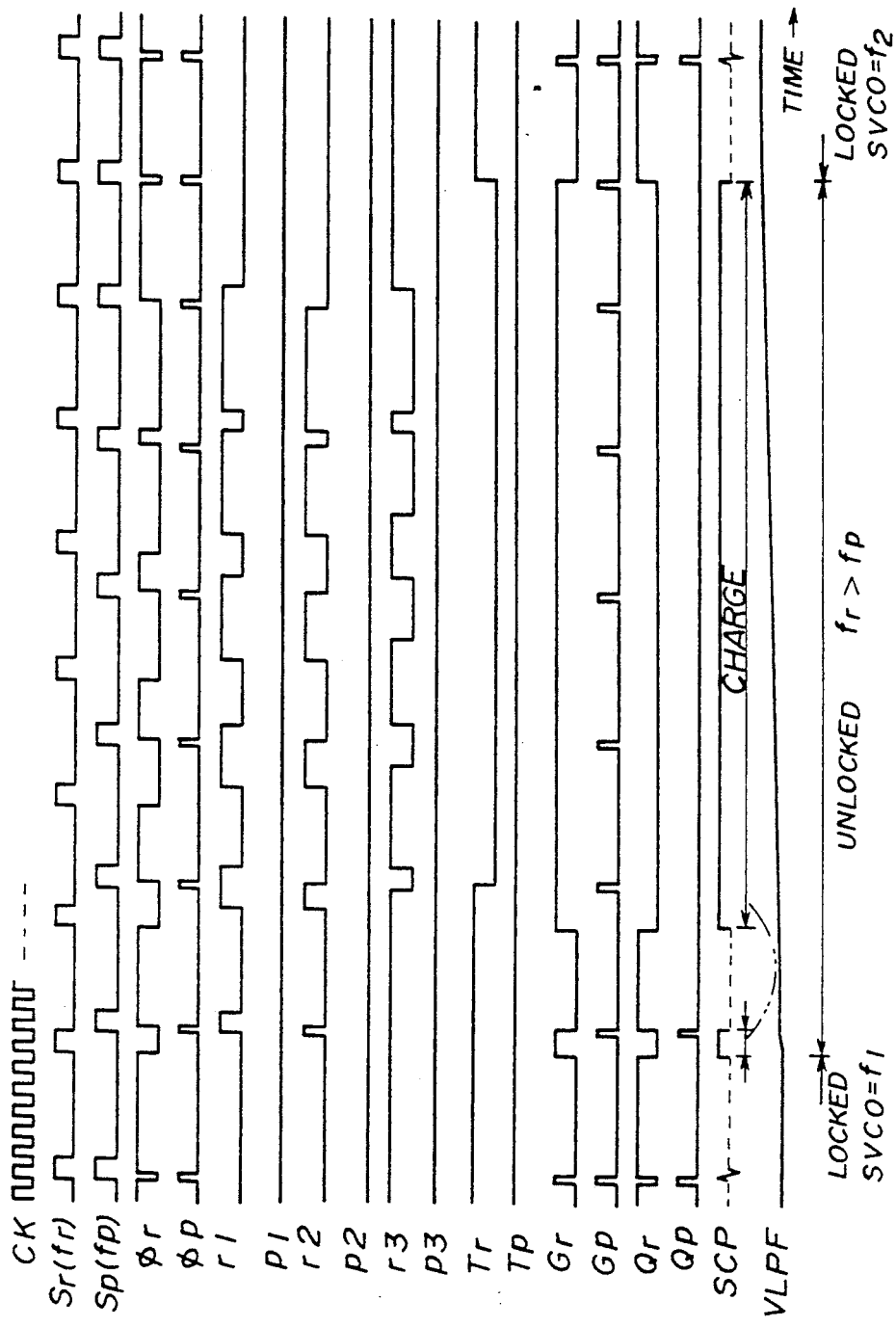
FIGS. 8 and 9 are timing charts for explaining an operation of the second embodiment.
Figure 9:
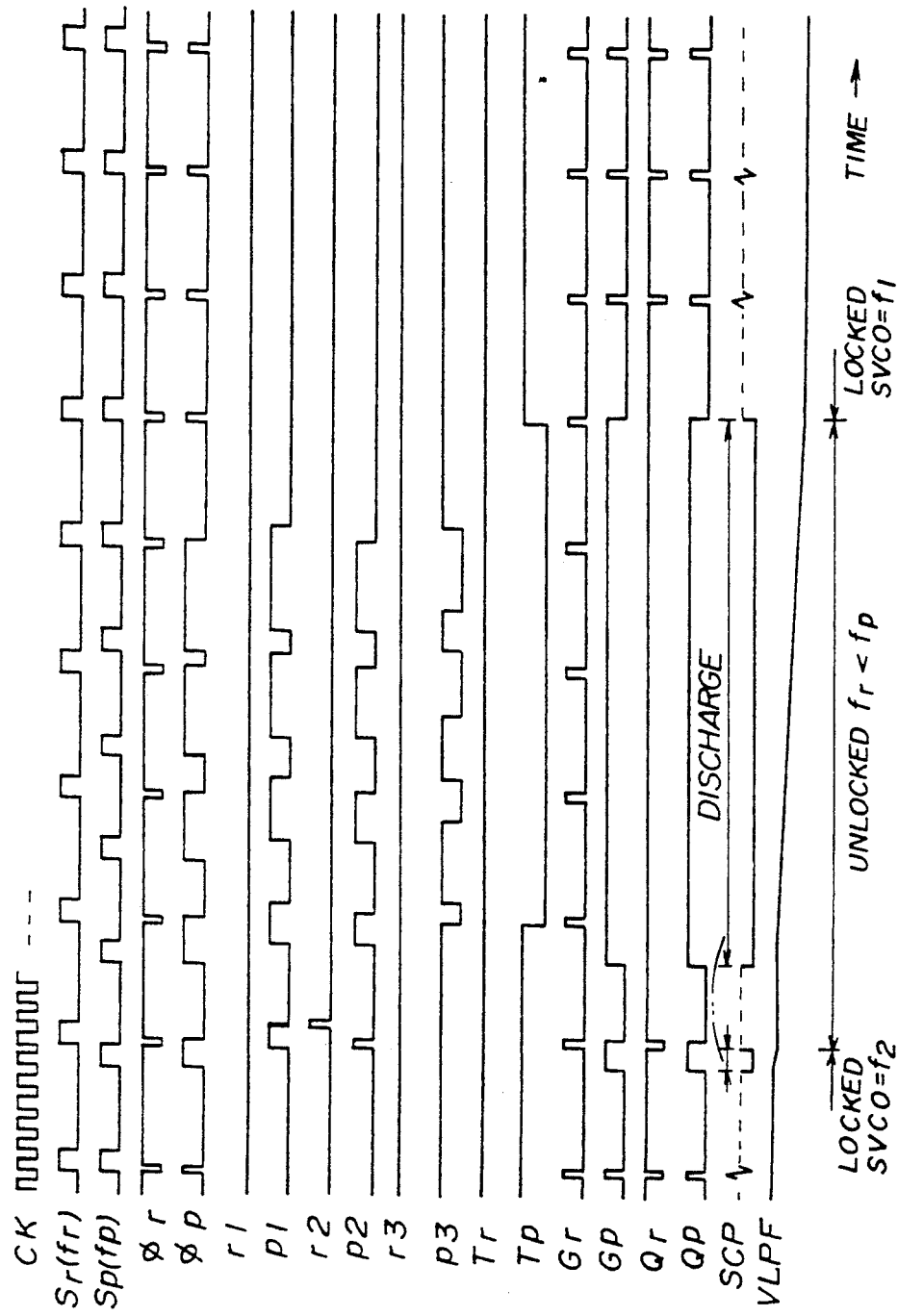

FIGS. 8 and 9 are timing charts for explaining the operation of the second embodiment. In FIGS. 8 and 9, r1 denotes an output signal of the D flip-flop 10, r2 denotes an output signal of the AND circuit 20, r3 denotes an output signal of the D flip-flop 11, Tr denotes an output signal of the D flip-flop 9, Gr denotes an output signal of the NAND circuit 22, Qr denotes an output signal of the NAND circuit 23, p1 denotes an output signal of the D flip-flop 13, p2 denotes an output signal of the AND circuit 21, p3 denotes an output signal of the D flip-flop, Tp denotes an output signal of the D flip-flop 12, Gp denotes an output signal of the NAND circuit 24, and Qp denotes an output signal of the inverter 19.

FIG. 8 shows the timings of the signals for explaining the operation when the frequency dividing ratio of the comparison frequency divider 3 is increased from the state where the output signal SVCO of the VCO 7 is locked to the frequency f1 and the output signal SVCO locks to the frequency f2 which is greater than the frequency f1.

On the other hand, FIG. 9 shows the timings of the signals for explaining the operation when the frequency dividing ratio of the comparison frequency divider 3 is decreased from the state where the output signal SVCO of the VCO 7 is locked to the frequency f2 and the output signal SVCO locks to the frequency f1.

As may be seen from FIG. 8, when the frequency dividing ratio of the comparison frequency divider 3 is increased from the state where the output signal SVCO of the VCO 7 is locked to the frequency f1 and state changes to the unlocked state where fr>fp, the charge pump circuit 5 supplies a charge voltage to the lowpass filter 6 during a time in which the reference signal Sr has a high level from a time when the unlocked state begins. Thereafter, the frequency of the output signal SVCO of the VCO 7 rises to the target frequency f2 from the time when the reference signal Sr next rises, and the capacitors 61 and 62 of the lowpass filter 6 are charged substantially without interruption until the phase of the comparison signal Sp and the phase of the reference signal Sr match. As a result, the output voltage VLPF of the lowpass filter 6 rises and the frequency of the output signal SVCO of the VCO 7 rises to the frequency f2.

When the frequency of the output signal SVCO of the VCO 7 rises to the frequency f2, the frequency fr of the reference signal Sr and the frequency fp of the comparison signal Sp become equal (that is, fr=fp). Hence, the phase comparison signal φr returns to the state which indicates that there is no phase error between the reference signal Sr and the comparison signal Sp, and the capacitors 61 and 62 of the lowpass filter assume the floating state. Consequently, the charged voltages in the capacitors 61 and 62 are held, and the output voltage VLPF of the lowpass filter 6 stabilizes to the voltage at which the frequency of the output signal SVCO of the VCO 7 becomes the frequency f2, and the frequency of the output signal SVCO of the VCO 7 locks to the frequency f2.

On the other hand, as may be seen from FIG. 9, when the frequency dividing ratio of the comparison frequency divider 3 is decreased from the state where the output signal SVCO of the VCO 7 is locked to the frequency f2 and state changes to the unlocked state where fr<fp, the charge pump circuit 5 discharges the capacitors 61 and 62 of the lowpass filter 6 during a time in which the comparison signal Sp has a high level from a time when the unlocked state begins. Thereafter, the frequency of the output signal SVCO of the VCO 7 falls to the target frequency f1 from the time when the comparison signal Sp next rises, and the capacitors 61 and 62 of the lowpass filter 6 are discharged substantially without interruption until the phase of the comparison signal Sp and the phase of the reference signal Sr match. As a result, the output voltage VLPF of the lowpass filter 6 falls and the frequency of the output signal SVCO of the VCO 7 falls to the frequency f1.

When the frequency of the output signal SVCO of the VCO 7 falls to the frequency f1, the frequency fr of the reference signal Sr and the frequency fp of the comparison signal Sp become equal (that is, fr=fp). Hence, the phase comparison signal φp returns to the state which indicates that there is no phase error between the reference signal Sr and the comparison signal Sp, and the capacitors 61 and 62 of the lowpass filter assume the floating state. Consequently, the charged voltages in the capacitors 61 and 62 are held, and the output voltage VLPF of the lowpass filter 6 stabilizes to the voltage at which the frequency of the output signal SVCO of the VCO 7 becomes the frequency f1, and the frequency of the output signal SVCO of the VCO 7 locks to the frequency f1.

Therefore, according to this embodiment, the capacitors 61 and 61 (shown in FIG. 2) of the lowpass filter 6 are charted or discharged substantially without interruption by providing the charge pump control circuit 8. For this reason, the output voltage VLPF of the lowpass filter 6 can be raised and lowered at a high speed compared to the conventional PLL synthesizer circuit in which the charging or discharging is carried out intermittently.

Figure 10:
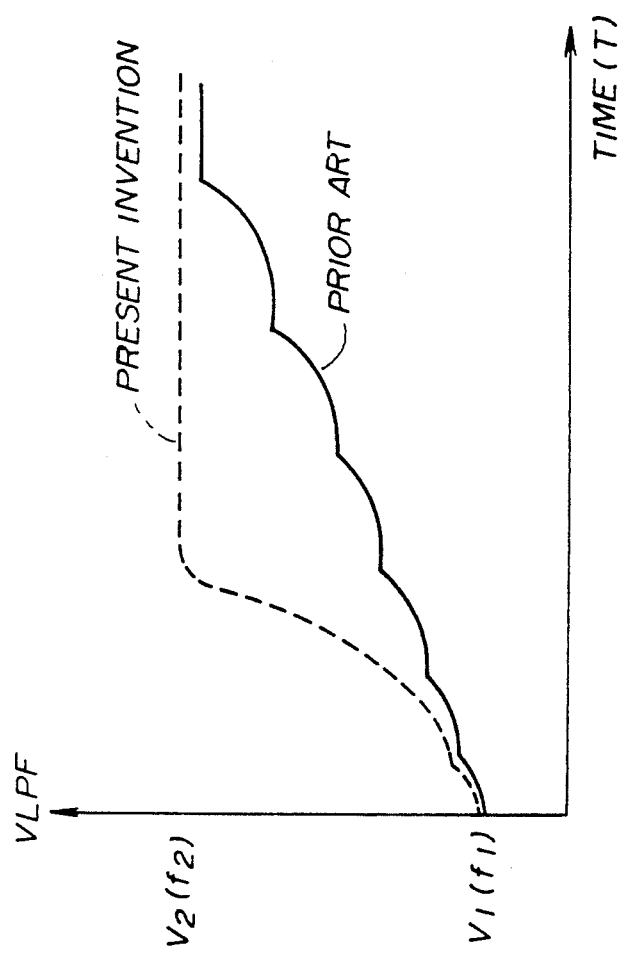
FIG. 10 is a timing chart for explaining the effects of the second embodiment.

FIG. 10 is a timing chart for explaining the change in the output signal SVCO of the VCO 7 when switching of the frequency of the output signal SVCO of the VCO 7 from the frequency f1 to the frequency f2. The change indicated by a dotted line in FIG. 10 is obtained in the second embodiment of the PLL synthesizer circuit, while the change indicated by a solid line in FIG. 10 is obtained in the conventional PLL synthesizer circuit. As may be seen from FIG. 10, the output voltage VLPF of the lowpass filter 6 can be changed at a high speed in the second embodiment when compared to the conventional PLL synthesizer circuit.

Figure 11:
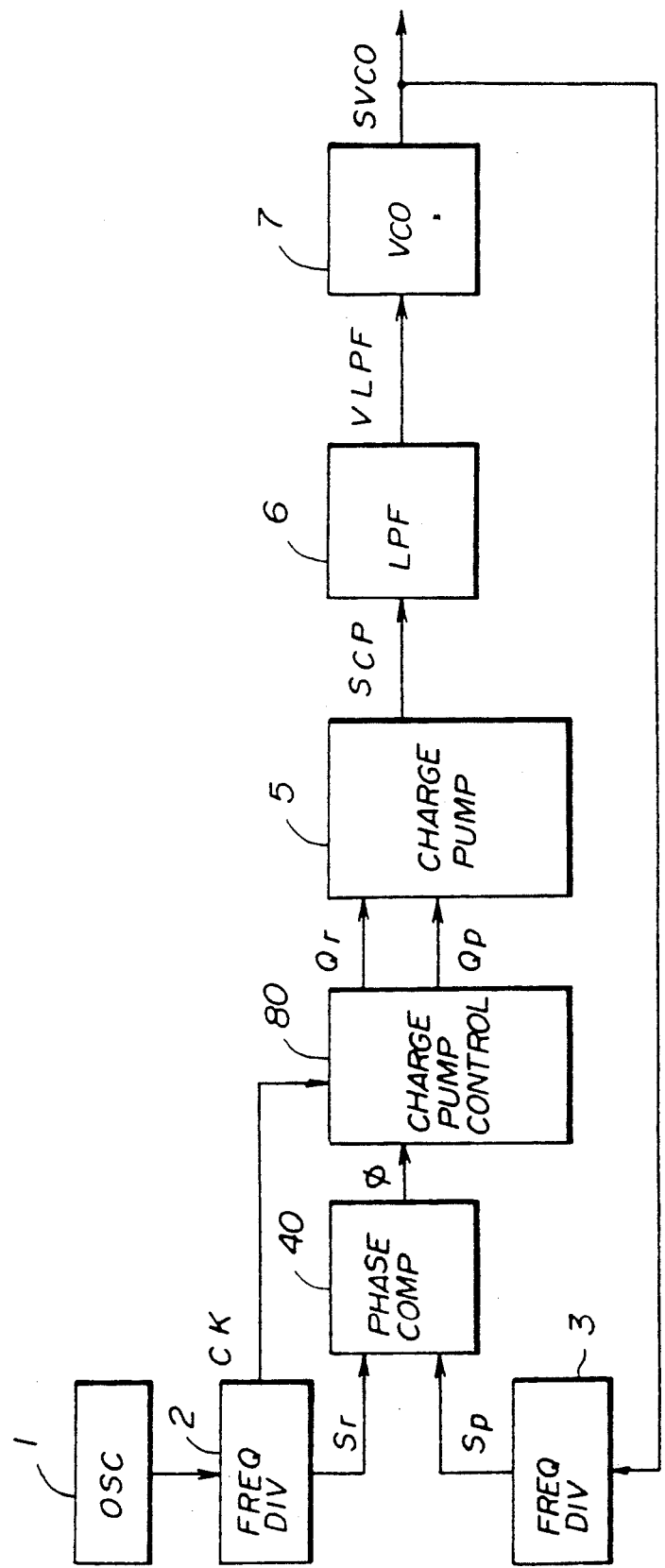
FIG. 11 is a system block diagram showing a third embodiment of the PLL synthesizer circuit according to the present invention.

Next, a description will be given of a third embodiment of the PLL synthesizer circuit according to the present invention, by referring to FIG. 11. In FIG. 11, those parts which are the same as those corresponding parts in FIG. 6 are designated by the same reference numerals, and a description thereof will be omitted.

In this embodiment, a phase comparator 40 outputs a phase error signal φ which indicates the phase error between the reference signal Sr and the comparison signal Sp. For example, this phase error signal φ may be a tri-level signal. A charge pump control circuit 80 forms the signals Qr and Qp based on the phase error signal φ, and supplies these signals Qr and Qp to the charge pump circuit 5. Of course, the charge pump control circuit 80 may form a tri-level control signal based on a tri-level phase error signal φ and control the charge pump circuit 5 by the tri-level control signal.

Figure 2:
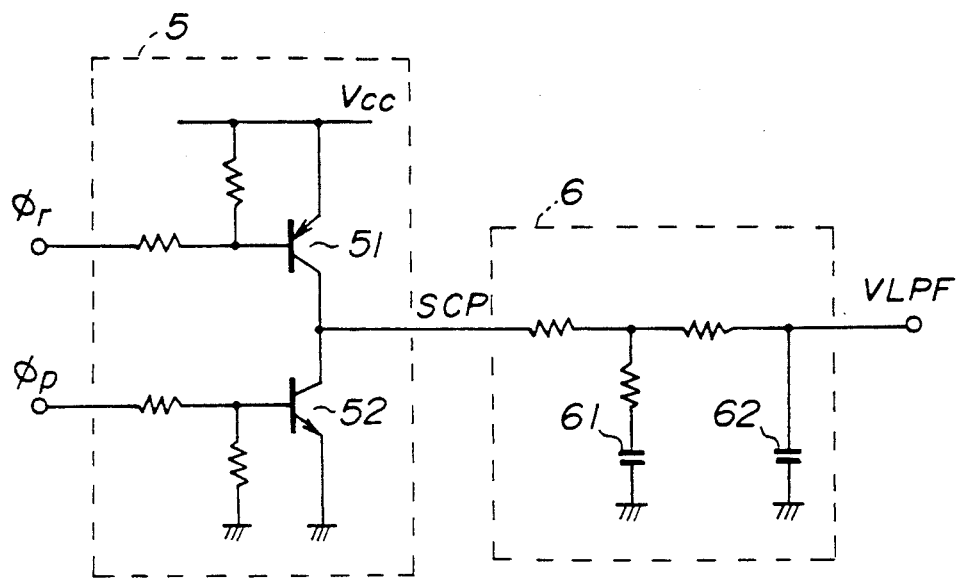
FIG. 2 is a circuit diagram showing a charge pump circuit and a lowpass filter of the conventional PLL synthesizer circuit shown in FIG. 1.
Figure 12:
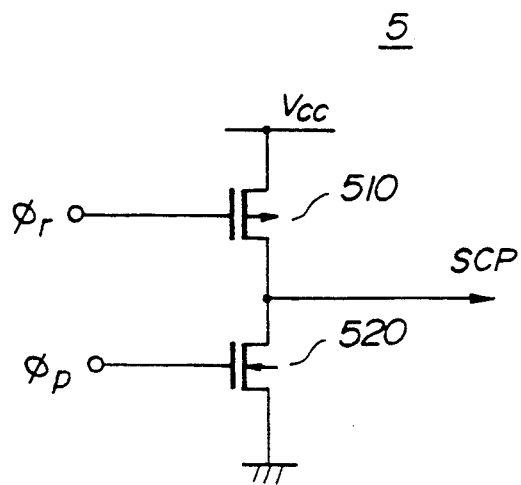
FIG. 12 is a circuit diagram showing a charge pump circuit which may be used in the present invention.
Figure 3:
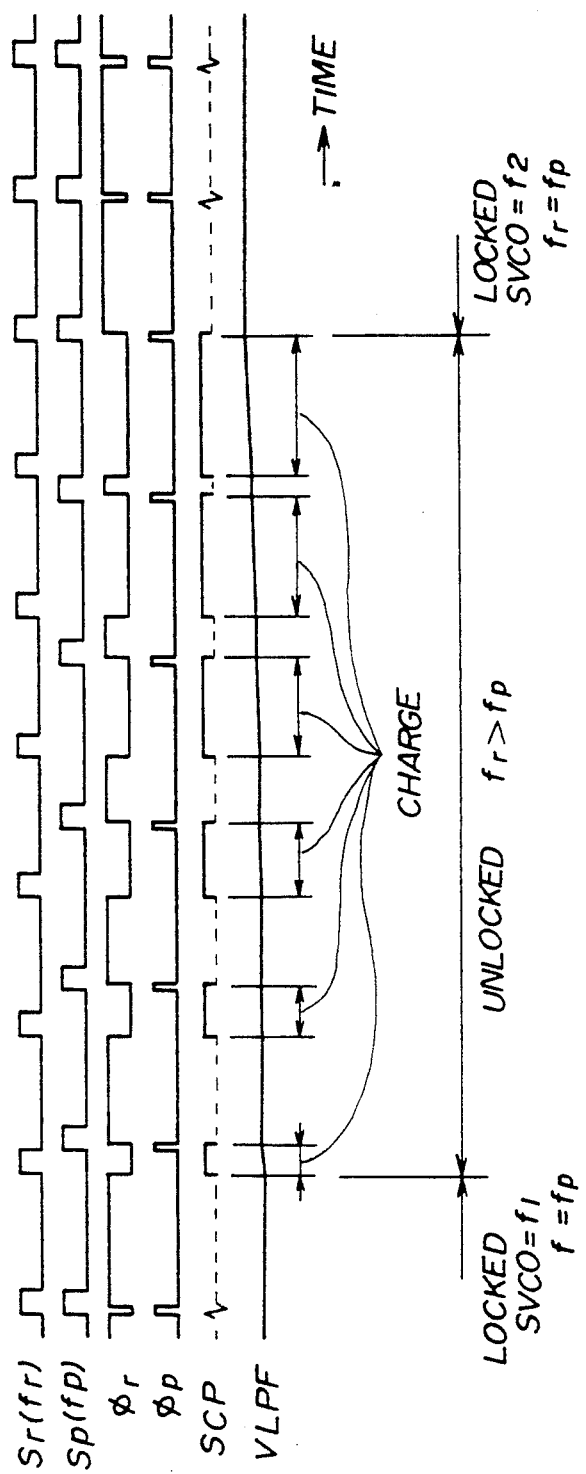
FIGS. 3 and 4 are timing charts for explaining an operation of the conventional PLL synthesizer circuit shown in FIG. 1.
Figure 4:
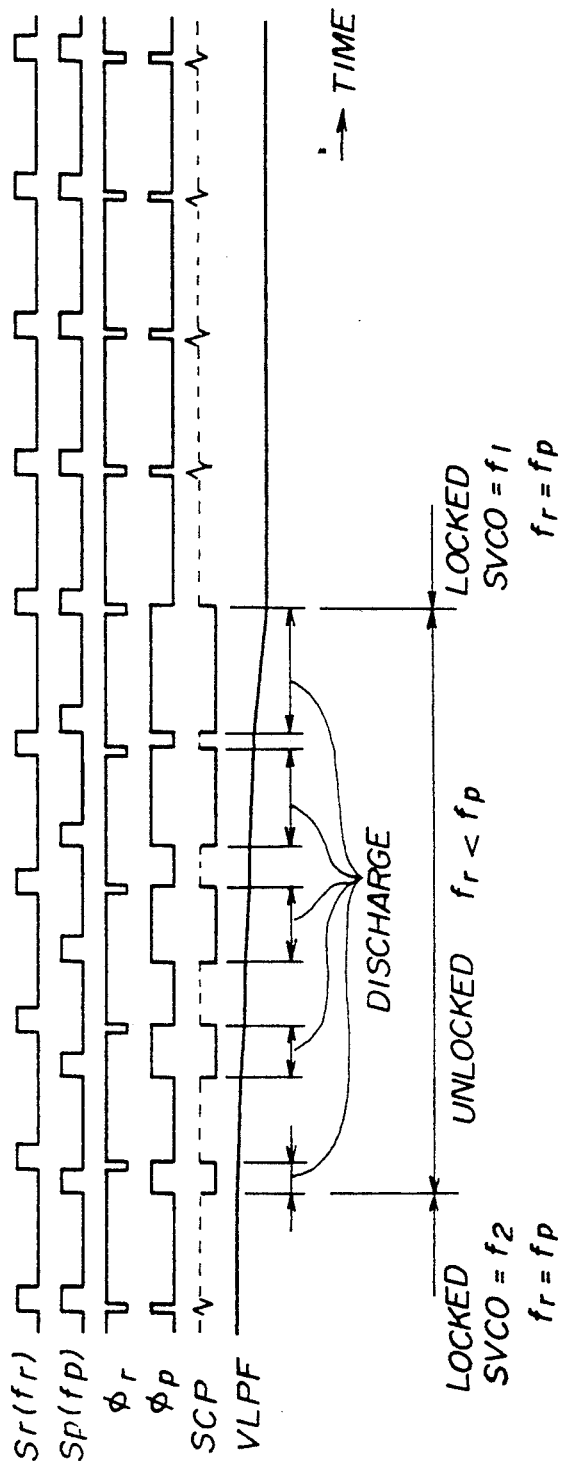

The charge pump circuit 5 which is used in the first through third embodiments is not limited to that shown in FIG. 2, and various other charge pump circuits may be used. FIG. 12 shows a charge pump circuit 5 which may also be used in the first through third embodiments. In FIG. 12, P-channel MOSFET 510 and an N-channel MOSFET 520 are used in place of the PNP transistor 51 and the NPN transistor 52 shown in FIG. 2, and the resistors shown in FIG. 2 are omitted.

Further, the present invention is not limited to these embodiments, but various variations and modifications may be made without departing from the scope of the present invention.

What is claimed is:

1. A phase locked loop synthesizer circuit comprising:
   a lowpass filter including capacitors for restricting an output voltage of the lowpass filter;
   a charge pump circuit, coupled to the lowpass filter, for controlling the output voltage of the lowpass filter by charging or discharging the capacitors of the lowpass filter;
   a voltage controlled oscillator, coupled to the lowpass filter, for outputting an output signal having a frequency which is controlled by the output voltage of the lowpass filter;
   a frequency divider, coupled to the voltage controlled oscillator, for frequency-dividing the output signal of the voltage controlled oscillator and for outputting a comparison signal, said frequency divider having a variable frequency dividing ratio;
   a phase comparator, coupled to the frequency divider, for comparing the phase of a reference signal having a predetermined frequency and the phase of the comparison signal output from the frequency divider, said phase comparator outputting phase error information which indicates a phase lead and a phase lag of the comparison signal with respect to the reference signal; and
   a charge pump control circuit, coupled between the phase comparator and the charge pump circuit, for forming control information based on the phase error information when switching the frequency of the output signal of the voltage controlled oscillator from a first frequency to a second frequency, and for supplying the control information to the charge pump circuit,
   said charge pump circuit charging or discharging the capacitors of the lowpass filter independently of the reference signal based on the control information until the output signal of the voltage controlled oscillator reaches the second frequency, so as to raise or lower the output voltage of the lowpass filter depending on the charging or discharging,
   the output signal of the voltage controlled oscillator being used as an output signal of the phase locked loop synthesizer circuit.

2. The phase locked loop synthesizer circuit as claimed in claim 1, wherein said charge pump control circuit forms the control information based on the phase error information in response to an external clock signal.

3. The phase locked loop synthesizer circui as claimed in claim 1, which further comprises a crystal oscillator for outputting a predetermined signal and a reference frequency divider for frequency-dividing the predetermined signal to output the reference signal together with a clock signal, and said charge pump control circuit forms the control information based on the phase error information in response to the clock signal.

4. The phase locked loop synthesizer circuit as claimed in claim 1, wherein said charge pump circuit charges or discharges the capacitors of the lowpass filter substantially without interruption based on the control information.

5. The phase locked loop synthesizer circuit as claimed in claim 1, wherein said phase comparator outputs the phase error information which is made up of a first signal which indicates the phase lead of the comparison signal with respect to the reference signal and a second signal which indicates the phase lag of the comparison signal with respect to the reference signal.

6. The phase locked loop synthesizer circuit as claimed in claim 5, wherein said charge pump control circuit outputs the control information which is made up of a third signal which corresponds to the first signal and a fourth signal which corresponds to the second signal.

7. The phase locked loop synthesizer circuit as claimed in claim 5, wherein said charge pump circuit includes first and second transistors of mutually opposite transistor types coupled in series between a power source and ground, and said first and second transistors are respectively controlled based on the first and second signals.

8. The phase locked loop synthesizer circuit as claimed in claim 7, wherein said first and second transistors respectively ar PNP and NPN transistors.

9. The phase locked loop synthesizer circuit as claimed in claim 7, wherein said first and second transistors respectively are P-channel and N-channel MOSFETS.

10. The phase locked loop synthesizer circuit as claimed in claim 7, wherein said first and second transistors of the charge pump circuit are coupled to each other at a node, and said lowpass filter receives the output signal of the charge pump circuit via the node.

* * * * *

UNITED STATES PATENT AND TRADEMARK OFFICE
CERTIFICATE OF CORRECTION

PATENT NO. : 5,166,644
DATED : November 24, 1992
INVENTOR(S) : Shinji SAITO et al.

It is certified that error appears in the above-indentified patent and that said Letters Patent is hereby corrected as shown below:

Col. 5, line 66, change "rl" to --r1--;

Col. 7, line 22, change "61 and 61" to --61 and 62--;
line 23, change "charted" to --charged--.

Col. 8, line 55, change "circui" to --circuit--.

Signed and Sealed this

Twenty-first Day of March, 1995

Attest:

BRUCE LEHMAN

Attesting Officer   Commissioner of Patents and Trademarks